United States Patent
Iwasaki et al.

(10) Patent No.: US 6,621,556 B2
(45) Date of Patent: Sep. 16, 2003

(54) PROJECTION EXPOSURE APPARATUS AND MANUFACTURING AND ADJUSTING METHODS THEREOF

(75) Inventors: Masaya Iwasaki, Kumagaya (JP); Osamu Yamashita, Musashino (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/785,197

(22) Filed: Feb. 20, 2001

(65) Prior Publication Data

US 2002/0030799 A1 Mar. 14, 2002

(30) Foreign Application Priority Data

Feb. 28, 2000  (JP) ........................................ 2000-051107

(51) Int. Cl.[7] ............................ G03B 27/42; G03B 27/58
(52) U.S. Cl. .......................................... 355/53; 355/72
(58) Field of Search .............................. 355/53, 72, 75; 248/550, 638

(56) References Cited

U.S. PATENT DOCUMENTS

| | | | | |
|---|---|---|---|---|
| 5,187,510 A | * | 2/1993 | Vogeley et al. | 353/122 |
| 5,187,519 A | * | 2/1993 | Takabayashi et al. | 355/53 |
| 5,204,712 A | * | 4/1993 | Bouwer et al. | 355/53 |
| 5,767,948 A | * | 6/1998 | Loopstra et al. | 355/53 |
| 5,781,277 A | * | 7/1998 | Iwamoto | 355/53 |
| 5,812,420 A | * | 9/1998 | Takahashi | 248/550 |
| 5,844,664 A | * | 12/1998 | Van Kimmenade et al. | 355/53 |
| 5,986,743 A | * | 11/1999 | Hanzawa | 248/550 |
| 6,008,883 A | * | 12/1999 | Kobayashi | 250/492.1 |
| 6,038,013 A | * | 3/2000 | Ohsaki | 248/550 |
| 6,202,492 B1 | * | 3/2001 | Ohsaki | 248/550 |
| 6,388,733 B1 | * | 5/2002 | Hayashi | 355/53 |

FOREIGN PATENT DOCUMENTS

| | | |
|---|---|---|
| EP | 0 811 883 B1 | 12/1997 |
| GB | 2299867 A | * 10/1996 |

* cited by examiner

*Primary Examiner*—Alan A. Mathews
(74) *Attorney, Agent, or Firm*—Oliff & Berridge, PLC

(57) ABSTRACT

With respect to a projection exposure apparatus in which a reticle is illuminated with an exposure beam and a wafer is exposed with the exposure beam via a projection optical system, the projection optical system is mounted on a frame mechanism slidable on a level block, and a wafer stage system is provided, on the level block, inside of the frame mechanism. Further, in order to pull the projection optical system out of the main body of the projection exposure apparatus, an adjustment table is provided separately from the level block, and after the wafer stage system being moved, the frame mechanism is moved onto the adjustment table, in a state that the frame mechanism is supporting the projection optical system.

26 Claims, 5 Drawing Sheets

PROJECTION EXPOSURE APPARATUS AND MANUFACTURING AND ADJUSTING METHODS THEREOF

BACKGROUND OF THE INVENTION

1. Field of the Invention

The present invention relates to an exposure apparatus used in a lithography process for manufacturing micro devices such as semiconductor devices, liquid crystal display devices, plasma display devices, and thin film magnetic heads and, more particularly, to a projection exposure apparatus that transfers a mask pattern onto a substrate via a projection optical system and to a manufacturing method of such an exposure apparatus.

2. Related Background Art

In the lithography process for manufacturing semiconductor devices etc. are used projection exposure apparatuses of one-shot exposure (stationary exposure) type or of scanning exposure type (e.g., projection exposure apparatuses of step-and-repeat type, so-called steppers; or projection exposure apparatuses of step-and-scan type, so-called scanning steppers). The projection exposure apparatus has a projection optical system that projects the mage of a pattern on a reticle as a mask onto a photosensitive substrate (a wafer, a glass plate, etc.), illuminates the reticle with exposure light, and exposes the substrate with the exposure light passing through the projection optical system.

With respect to the exposure apparatus, along with, for example, the miniaturization of patterns transferred onto the wafer, a higher exposure accuracy is not required. To address the requirement, the numerical aperture of the projection optical system of the projection exposure apparatus has become larger to enhance the resolution of the projection optical system, and at the same time the wavelength of the exposure light has been made to be shorter. Accordingly, the projection optical system has become large-sized due to the enlargement of the numerical aperture, and at the same time, the configuration of the projection optical system has become complicated due, for example, to the use of refractive members made of optical materials with high transmittance relative to short wavelength exposure light and to the use of reflective members.

On the other hand, in each of the reticle stage system positioning the reticle and the wafer stage system two-dimensionally moving the wafer is adopted a configuration that enables high-precision positioning or high-precision scanning. Conventional projection exposure apparatuses have been manufactured by, after fixing the projection optical system on a certain frame mechanism, framing the reticle stage system and the wafer stage system with a predetermined positional relationship with reference to the projection optical system.

Further, in the case of using ultraviolet light as the exposure light, it is known that the ultraviolet light chemically reacts with a small amount of organic substances, etc. residing in the air, and fogging materials are generated onto the surfaces of lenses, etc. constituting the projection optical system. The fogging materials cause the decrease of the transmittance of the projection optical system. In consideration of this, the organic substances, etc. have been conventionally removed from the gas surrounding the projection optical system by using a chemical filter and the like.

With respect to recent projection exposure apparatuses, to further enhance the resolution addressing further miniaturization of semiconductor integrated circuits, etc., KrF excimer lasers (of 248 nm wavelength), as the exposure light source, are gradually being replaced with ArF excimer lasers of vacuum ultraviolet region (of 193 nm wavelength), and further, the use of $F_2$ lasers (of 157 nm wavelength) and of $Kr_2$ lasers (of 146 nm wavelength) of further shorter wavelength as the exposure light source is also studied.

When vacuum ultraviolet light of a wavelength of about 200 nm or less is used as the exposure light, the absorption (attenuation) amount of the exposure light by the air (in particular, by oxygen) becomes greater, compared with the use of far ultraviolet light. To address this problem, it is preferable that high-purity gas (purge gas), e.g., nitrogen gas or helium gas, which has high transmittance relative to ultraviolet light and from which impurities such as organic substances and oxygen are removed is supplied into the optical path, in the projection exposure apparatus, through which the exposure light passes. Further, with respect to projection exposure apparatuses using exposure light of ultraviolet region, optical materials with high transmittance relative to the exposure light, e.g., synthetic quartz and fluoride ($CaF_2$), are used as the refractive members of the projection optical system.

However, even when optical materials with high transmittance relative to the exposure light and purge gas are used, the transmittance of the projection optical system inevitably decreases to some extent. For instance, when fogging materials are generated on the optical members constituting the projection optical system because of a small amount of organic substances, etc. remaining in the purge gas, the transmittance of the projection optical system may decreased to a level below a permissible level. To clean, replace, or readjust the fogged optical members under those circumstances, it may be required to dismount the projection optical system from the main body of the exposure apparatus. Also, it is preferable that when the readjustment etc. of the projection optical system requires a considerable time, another projection optical system of which optical adjustment, etc. have been completed, in place of the former, be mounted on the main body of the exposure apparatus to prevent the decrease of the operation rate of the projection exposure apparatus. In addition, when, other than the transmittance decrease, a predetermined aberration of the projection optical system deteriorates down to a level below a permissible level because of, e.g., outside vibration, etc., it may be required to dismount and readjust the projection optical system or to, alternatively, replace it with another one.

However, with respect to the conventional projection exposure apparatus, a wafer stage system, etc. should be dismounted before dismounting the projection optical system, and thus it is required to disassemble substantially the main parts of the projection exposure apparatus. Accordingly, the disassembling operations of the projection exposure apparatus become complicated and require a long time. In addition, the conventional projection exposure apparatus has many units that are assembled with reference to the projection optical system. Thus, when mounting the projection optical system of which adjustment have been completed on the main body of the exposure apparatus, a great many operations must be executed, and, as a disadvantageous result, the maintenance costs increase along with the delayed restart of the projection exposure apparatus, i.e., the decrease of the operation rate thereof.

SUMMARY OF THE INVENTION

It is an object of the present invention to provide a projection exposure apparatus of which projection system can be easily dismounted or replaced. Further, it is another object to provide a projection exposure apparatus of which adjustment can be easily performed. Further, it is still another object to provide a manufacturing method of a projection exposure apparatus of which maintenance etc. can be easily performed.

A first projection exposure apparatus according to the present invention is a projection exposure apparatus by which an object is exposed with an exposure beam via a projection system, which is provided with a base member and with a frame mechanism slidable on the base member, and in which the projection system is mounted on the frame mechanism. Thus, by sliding the frame mechanism, dismounting, replacing, etc. of the projection system can be performed extremely easily.

Further, a second projection exposure apparatus according to the present invention is a projection exposure apparatus by which an object is exposed with an exposure beam via a projection system and which is provided with a base member, with a frame mechanism on which the projection system is mounted and which is disposed on the base member via a leg portion, and with a stage system, slidable in a predetermined direction, at least of which supporting portion is positioned, on the base member, inside of the leg portion and which drives the object.

Relative to the second projection exposure apparatus, as a first method, after sliding the stage system in the predetermined direction and pulling it out, by sliding the frame mechanism, still carrying the projection system, in the predetermined direction, the projection system can be easily dismounted. Also, as a second method, by directly sliding the frame mechanism in the opposite direction to the predetermined direction, the projection system can be easily dismounted. Next, after, for example, readjusting the projection system on the frame mechanism or replacing it with another projection system of which adjustment has been completed, by executing a sequence reverse to that of the first or second method, the frame mechanism, i.e., the projection system, can be easily positioned again to the exposure position.

Relative to the above, as shown in FIG. 4 by way of example, the leg portion of the frame mechanism may be constituted of three leg portions (14A–14C), each of which is positioned substantially at each apex of a triangle; and in this case width D1 of the supporting portion (22A–22C) of the stage system is preferably smaller than distance D2 between a prescribed pair of neighboring leg portions (14A and 14B) among the three leg portions of the frame mechanism. With this configuration, the above-described first method can be used with the stage system being slid and pulled out in the direction of the two leg portions (14A and 14B).

Further, as shown in FIG. 5 as another example, the leg portion of the frame mechanism may be constituted of four leg portions (14A–14D), each of which is positioned substantially at each apex of a rectangle; and in this case the width of the supporting portion (22A–22D) of the stage system is preferably smaller than the distance between a prescribed pair of neighboring leg portions (14C and 14D) among the four leg portions of the frame mechanism. With this configuration, because the stage system can be slid in the direction (B4) of the two leg portions (14C and 14D), the above-described second method can be used with the frame mechanism being slid in the direction (B1) opposite to the former.

Further, it is preferable that air pads for jetting compressed gas are provided on the bottom surface of the leg portion of the frame mechanism. Through this, the frame mechanism can be smoothly slid on the base member.

Next, a manufacturing method of a projection exposure apparatus, according to the present invention, is a manufacturing method of a projection exposure apparatus which exposes an object with an exposure beam via a projection system; and comprises a first step of disposing a frame mechanism that supports the projection system on a predetermined base member via a leg portion and a second step of disposing, inside of the leg portion on the base member, a stage system that drives the object, in a state that the stage can be slid in a predetermined direction. By this manufacturing method, the projection exposure apparatuses according to the present invention can be effectively manufactured.

Relative to the above method, if the above-described first method is applied when the projection system is replaced, after carrying, along the predetermined direction, the stage system out of the base member, the frame mechanism can be carried out of the base member, in a state that the frame mechanism is supporting the projection system.

Further, if the above-described second method is applied when the projection system is replaced, with the frame mechanism being moved, on the base member, in the direction opposite to the predetermined direction in a state that the frame mechanism is supporting the projection system, the frame mechanism can be carried out of the base member.

As can be seen from the above, a projection exposure apparatus which facilitates the dismount, replacement, etc. of its projection system (projection optical system) can be realized. By this, replacement of a projection system can be completed in a short time period not only in a projection exposure apparatus manufacturing plant but also at a point of delivery (device manufacturing plant, etc.); and thus manufacturing costs of the projection exposure apparatus can be decreased, and the operation or maintenance costs thereof can also be decreased. Further, the rate of the projection exposure apparatus, i.e., the productivity of device manufacturing process can also be improved.

DETAILED DESCRIPTION OF THE PREFERRED EMBODIMENTS

Figure 1:
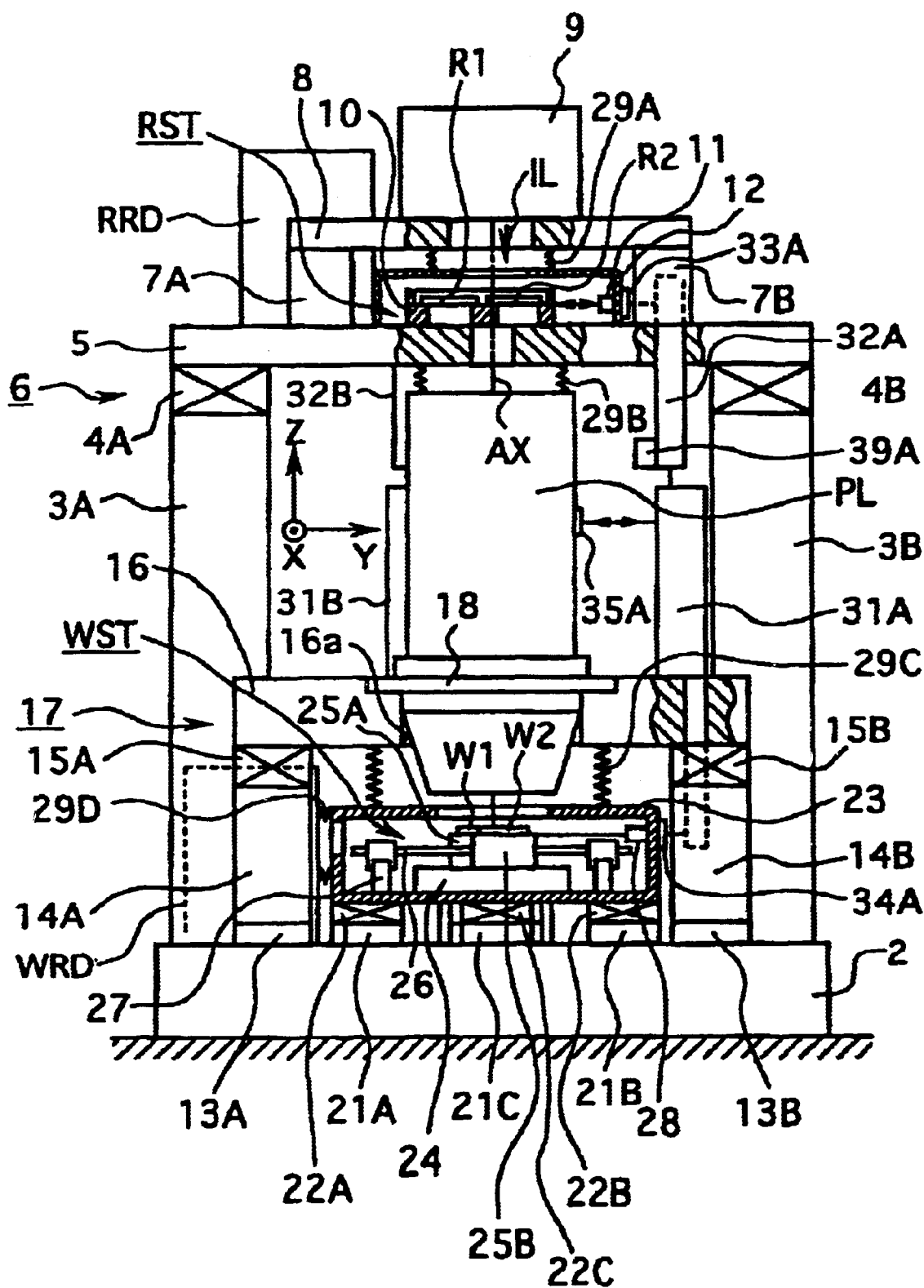
FIG. 1 is a partly broken-away front view illustrating a projection exposure apparatus of an embodiment according to the present invention.

Referring to the drawings, an embodiment according to the present invention will now be described. This embodiment is an embodiment in which the present invention is applied to a scanning exposure type projection exposure apparatus, in which a step-and-scan system or a step-and-stitch system is adopted.

As an exposure light source (not shown) of the projection exposure apparatus of this embodiment, an ArF excimer laser light source (of 193 nm wavelength) is used; however, other light sources emitting vacuum ultraviolet light (light of 200 nm or less wavelength, in this embodiment) such as an $F_2$ laser light source (of 157 nm wavelength), a $Kr_2$ laser light source (of 146 nm wavelength), a harmonic wave generation device of YAG/Laser light, and a harmonic wave generation device of semiconductor laser light or other light sources emitting far ultraviolet light such as a KrF excimer laser light source (of 248 nm wavelength) and the above-mentioned harmonic wave generation device may also be used. Further, as the exposure light source, a mercury lamp emitting the i-line, the g-line, etc. may also be used. Irrespective of the kind of the exposure light source, the present invention can be applied to a projection exposure apparatus that requires replacement of the projection optical system as described later.

When vacuum ultraviolet light is used as the exposure beam as in this embodiment, the vacuum ultraviolet light is heavily absorbed by light absorbing substances (impurities) existing in the air such as oxygen, water vapor, hydrocarbonaceous gases (carbon dioxide, etc.), organic substances, and halides; it is therefore preferable that, to prevent the attenuation of the exposure beam, the concentrations on the optical path of the exposure beam of those light absorbing substances be controlled within a level of about 10 to 100 ppm on average. Thus, in this embodiment, the gas on the optical path of the exposure beam is replaced with gas that transmits the exposure light (gas that attenuates very little the exposure light), i.e., gas which has high transmittance relative to the exposure beam, which is chemically stable, and from which light absorbing substances are removed to a high degree (hereinafter, also called "purge gas") such as nitrogen gas, a rare gas, i.e., helium (He), neon (Ne), argon (Ar), krypton (Kr), xenon (Xe), and radon (Rn), or the like. Nitrogen gas and rare gases are also collectively called "inert gas."

It is to be noted that the concentrations (or the permissible level) of the light absorbing substances (impurities) may be varied depending upon the kinds of the light absorbing substances existing on the optical path of the exposure beam; for example, organic light absorbing substances are most strictly controlled by setting their concentrations within a level of about 10 ppm, and the concentrations of water vapor and other substances, in this order, may be relaxed. Further, it may be so configured that some of the concentrations (or the permissible level) of the light absorbing substances of the optical path in an illumination optical system, the optical path in a projection optical system, the inside of a wafer chamber, the inside of a reticle chamber, the inside of the loader system, etc., each described later, are separately controlled by setting the concentrations differently.

By the way, nitrogen gas may be used, even for vacuum ultraviolet range light, as a gas that transmits the exposure light (purge gas) at a wavelength down to about 150 nm, but nitrogen gas substantially acts as a light absorbing substance for light of about 150 nm or less wavelength. It is therefore preferable that a rare gas be used as purge gas for an exposure beam of about 150 nm or less wavelength. Additionally, among rare gases, helium gas is preferable from the viewpoint of refractive index stability, high thermal conductivity, etc. However, since helium is expensive, other rare gases may be used when importance is attached to operation costs, etc. Further, as the purge gas, a mixed gas of, e.g., nitrogen and helium mixed at a predetermined mixture ratio may be supplied without being restricted to supplying a single kind of gas.

In this embodiment, attaching importance to refractive index stability (imaging characteristics stability), high thermal conductivity (high cooling effect), etc., helium gas is used as the purge gas. For this end, in, e.g., a downstairs utility room beneath the floor on which the projection exposure apparatus of this embodiment is set is installed a gas supply apparatus (not shown) which supplies high-purity purge gas, at a pressure slightly higher than the atmospheric pressure (positive pressure), into a plurality of airtight chambers of the projection exposure apparatus-and apparatuses attached to the projection exposure apparatus and which, as required, recovers the gas supplied into the airtight chambers, to reuse the gas.

Figure 2:
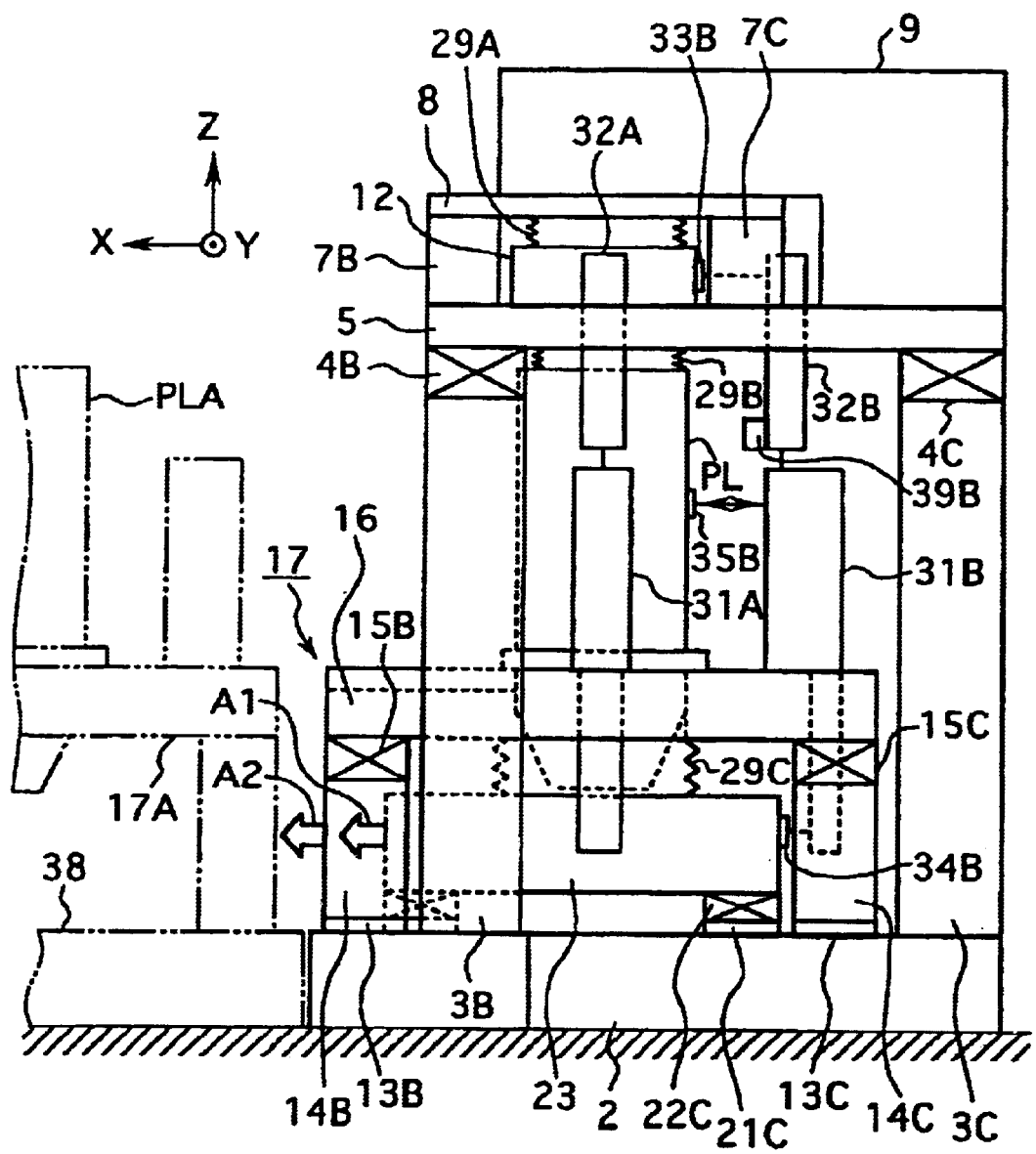
FIG. 2 is a side view illustrating the projection exposure apparatus of FIG. 1.

Next, the configuration of the projection exposure apparatus of this embodiment will be described in detail. FIG. 1 is a partly broken-away front view illustrating the projection exposure apparatus of the embodiment; FIG. 2 is a side view illustrating the projection exposure.

In FIG. 1, sub-chamber 9, as an airtight chamber, accommodates an illumination optical system constituted of an optical integrator (uniformizer or homogenizer) for uniforming the illuminance distribution, a variable aperture stop (σ-stop) for changing the illumination conditions, a relay lens, a field stop, a condenser lens, etc.; and pulse laser light of 193 nm wavelength, as the exposure beam, emitted from an exposure light source, not shown, i.e., exposure light (illumination light for exposure) IL, illuminates, via the illumination optical system in sub-chamber 9, a slit-like illumination area defined on reticle R1 (or R2) as a mask. This illumination area is defined, for example, as an area of which center is substantially the point at which optical axis AX of projection optical system PL and the area intersect in the circular view field of projection optical system PL and which lies along a non-scanning direction perpendicular to the direction in which the reticle is moved relative to the area during scanning exposure.

Exposure light IL impinged on reticle R1 (or R2) enters projection optical system PL as a projection system. Further, exposure light IL passed through projection optical system PL impinges on a slit-like exposure area (an area conjugate with the illumination area with respect to projection optical system PL) defined on wafer W1 (or W2) coated with photoresist, as a photosensitive substrate (substrate to be exposed). That is, a part of a pattern formed on reticle R1 (or R2) in the illumination area is projected onto the exposure area with a projection magnification of β (β is ¼, ⅕, etc.) by projection optical system PL.

Further, with the projection magnification of β as the velocity ratio, reticle R1 and wafer W1 are synchronously moved in a predetermined scanning direction; in other words, in synchronization with reticle R1 being relatively moved relative to the illumination area, wafer W1 is moved relatively moved relative to the exposure area. Through this synchronized movement, with the entire area, on reticle R1, on which the pattern is formed being illuminated with exposure light IL and at the same time with a predetermined area (shot area), on wafer W1, onto which the pattern is to be transferred, being scan-exposed with exposure light IL, the pattern image of reticle R1 is transferred onto the one shot area on wafer W1. Here, reticles R1 and R2 can be regarded as a first object; wafers W1 and W2 can be regarded as a second object; and wafers W1 and W2 correspond to the object to be exposed of the present invention. Wafers W1 and W2 are, for instance, a circular substrate having a diameter of 200 mm or 300 mm such as a semiconductor (silicon, etc.) wafer, an SOI (silicon on insulator) wafer, or the like.

As projection optical system PL, as disclosed in, for example, International application No. WO 00/39623 and its counterpart U.S. patent application Ser. No. 644,645 (filed on Aug. 24, 2000), a straight-barrel type catadioptric system configured by disposing, along its optical axis, a plurality of refractive lenses and two concave mirrors each having an aperture in the vicinity of the optical axis, a straight-barrel type refractive system configured by disposing refractive lenses along its optical axis, etc. may be used. Further, as projection optical system PL, a double-barrel type catadioptric system or the like may be used. As optical materials in projection optical system PL, synthetic quartz, quartz doped with predetermined impurities (e.g., fluorine), and fluorite can be used.

Hereinafter, a description will be given by setting a Z-axis parallel to optical axis AX of projection optical system PL, setting a Y-axis along the scanning direction, in a plane perpendicular to the Z-axis (which, in this embodiment, substantially coincides with a horizontal plane), in which reticle R1 and wafer W1 are moved during scanning exposure (i.e., a direction parallel to the plane of FIG. 1), and by setting an X-axis along the non-scanning direction perpendicular to the scanning direction (i.e., a direction perpendicular to the plane of FIG. 1).

Figure 4:
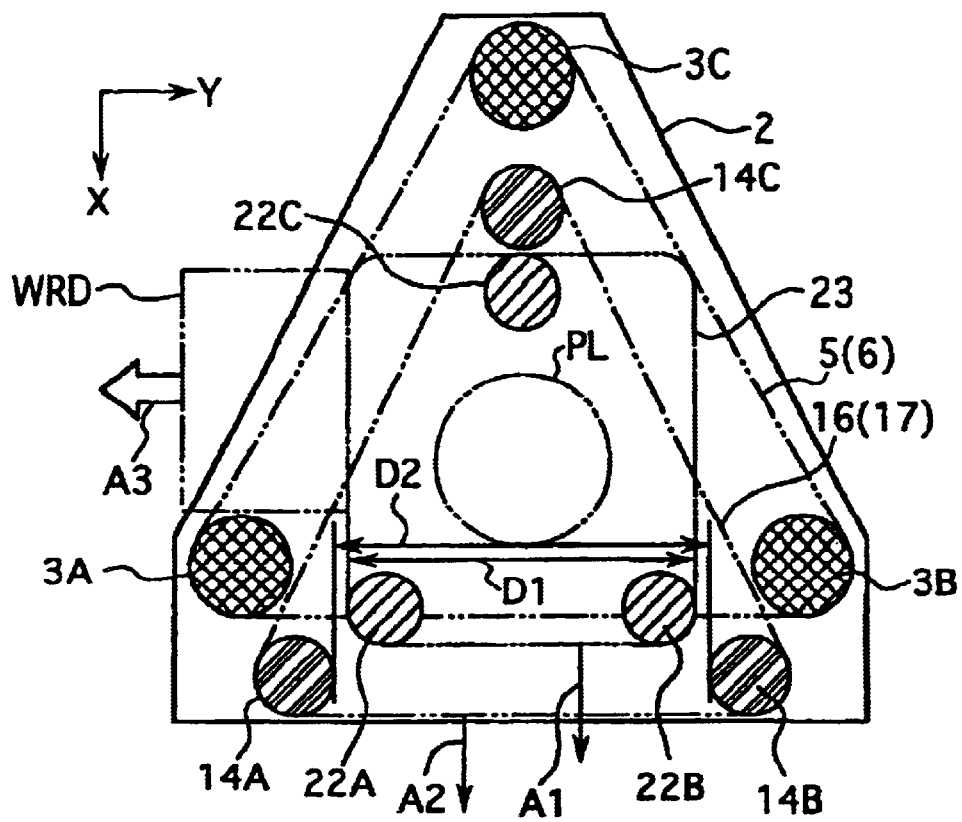
FIG. 4 is a plan view illustrating the level block of FIG. 1.

Next, the overall configuration of the main body of the exposure apparatus of this embodiment including a stage system supporting reticles R1 and R2, projection optical system PL, and a stage system supporting wafers W1 and W2 will be described. Note that a high-rigidity, thick, flat level block 2 is set as a base member. As shown in FIG. 4, a plan view illustrating level block 2, the shape of level block 2 is substantially triangular.

Referring back to FIGS. 1 and 2, on level block 2 are positioned three (may be four or more) columns 3A, 3B, and 3C so that each column is located at each apex of a triangle; and on columns 3A–3C is set, via antivibration bases 4A–4C, a high-rigidity, triangular, flat supporting plate 5 in which center an aperture for exposure light IL to pass through is formed. Each of antivibration bases 4A–4C is an active type antivibration device comprising a mechanical damper, capable of bearing a heavy weight, such as an air damper or a hydraulic damper and an electromagnetic damper constituted of an actuator such as a voice coil motor. In this embodiment, first frame mechanism 6 is constituted of columns 3A–3C, antivibration bases 4A–4C, and supporting plate 5.

The upper surface of supporting plate 5 is finished as a guide surface with a very high degree of flatness; on the guide surface is, via an air bearing, smoothly, two-dimensionally slidably disposed reticle stage 10; and on reticle stage 10 are, by vacuum suction or the like, held reticles R1 and R2 neighboring to each other. Reticle stage 10 of this embodiment is thus a double-holder system, which efficiently enables, e.g., double exposure; however, a double-stage system, in which a movable stage is used for each reticle, may also be adopted. Also, reticle stage 10 may be a single-stage system, on which only a single reticle is held.

Reticle stage 10 is constituted of, for example, a fine stage that holds reticles R1 and R2 and a frame-shaped coarse stage surrounding the fine stage. By driving the coarse stage in the Y-direction (scanning direction) by a linear motor, not shown, and at the same time by finely driving the fine stage in the X-, Y-, and rotational directions relative to the coarse stage by, e.g., three actuators, reticles R1 and R2 can be driven in the plus Y- or minus Y-direction at a desired scanning velocity with high precision, and synchronization errors between reticle R1 and wafer W1 can also be corrected. Also, reticle stage 10 is driven, by the use of a moving member (e.g., counter mass), not shown, so that the law of conservation of momentum with respect to the Y-direction is satisfied, and thus it is so configured that almost no vibrations are generated during scanning exposure.

Further, reticle interferometer 11 constituted of a laser interferometer is positioned for measuring the positional information of reticle stage 10 in the X- and Y-directions and the rotational angles thereof around the X-, Y-, and Z-directions. In this embodiment, reticle stage system RST is constituted of reticle stage 10, a drive device thereof (not shown), reticle interferometer 11, etc.; reticle stage system RST is covered with a box-shaped reticle chamber (first stage chamber) 12 with high hermeticity; and a window portion which makes exposure light IL pass through is formed at the center of the upper plate of reticle chamber 12.

Reticle interferometer 11 of this embodiment measures the position of reticle stage 10 with reference to a reference mirror, not shown, fixed on reticle chamber 12; however, alternatively, the position of reticle stage 10 may be measured with reference to a reference mirror set on projection optical system PL.

Further, on supporting plate 5 are positioned three columns 7A, 7B, and 7C so that each column is located at each apex of a triangle surrounding reticle chamber 12; on columns 7A–7C is set supporting plate 8 in which an aperture for exposure light IL to pass through is formed; and on supporting plate 8 and supporting plate 5 is set sub-chamber 9 which accommodates at least a part of the illumination optical system. Further, in an area on supporting plate 5, neighboring reticle chamber 12 in the minus Y-direction side, is set reticle loader system RRD for changing reticles R1 and R2 on reticle stage 10. Reticle loader system RRD is, e.g., box with some degree of hermeticity in which a reticle exchange mechanism is accommodated. Note that reticle loader system RRD may be set on a frame mechanism different from first frame mechanism 6.

Next, in FIGS. 1 and 2, on an area on level block 2 substantially surrounded by the three columns 3A, 3B, and 3C of first frame mechanism 6 are mounted three circular air pads 13A, 13B, and 13C at each apex of a triangle so that the pads can slide in the X- and Y-directions; on air pads 13A–13C are fixed columns 14A–14C, respectively; and on columns 14A–14C is set a high-rigidity, triangular, flat supporting plate 16 via active type antivibration bases 15A–15C having a similar configuration to that of antivibration bases 4A–4C. To a U-shaped, cut-out portion 16a formed in the supporting plate 16 ranging from its plus x-direction side (the front side direction of FIG. 1) end portion to its center portion is mounted projection optical system PL via a flange portion; and the open end of cut-out portion 16a is closed by fixing thereto a flat connecting member 18 with bolts. In other words, projection optical system PL is supported so that it can be put in and out relative to supporting plate 16.

In this embodiment, second frame mechanism 17 is constituted of air pads 13A–13C, columns 14A–14C, antivibration bases 15A–15C, and supporting plate 16; and this second frame mechanism 17 corresponds to the frame mechanism of the present invention. In this embodiment, second frame mechanism 17 can be smoothly slid on level block 2 through air pads 13A–13C.

Figure 3:
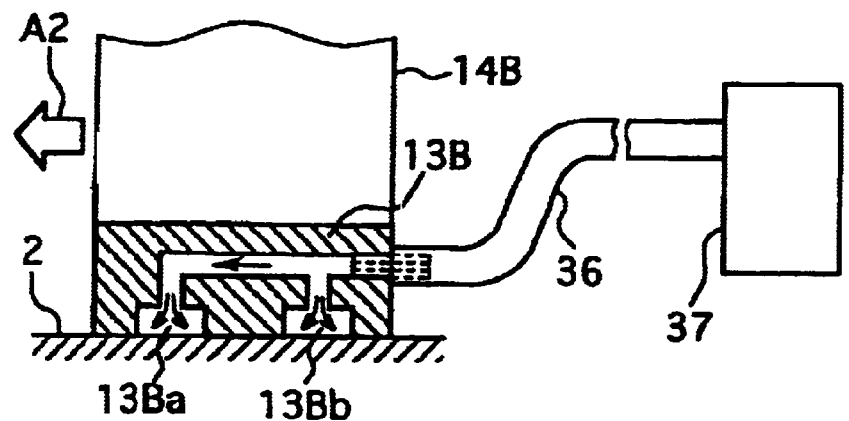
FIG. 3 is a partly broken-away, enlarged view illustrating a main part of a configuration when the air pad of FIG. 2 is connected to a compressor.

FIG. 3 is an enlarged view illustrating the configuration of air pad 13B in FIG. 1. In FIG. 3, on the bottom surface of air pad 13B, i.e., on the contact surface facing level block 2, are formed blowout outlets 13Ba and 13Bb for jetting compressed high-pressure gas. And when column 14B is to be moved, compressor 37 that supplies high-pressure gas is connected to air pad 13B via piping 36, and the high-pressure gas is jetted out from blowout outlets 13Ba and 13Bb of air pad 13B. By similary jetting high-pressure gas from the other air pads 13A and 13C, second frame mechanism 17 can be smoothly moved on level block 2 with a little force.

Referring back to FIGS. 1 and 2, on an area on level block 2 substantially surrounded by second frame mechanism 17, i.e., on an area substantially surrounded by the three columns 14A–14C of second frame mechanism 17, are mounted three air pads 21A, 21B, and 21C so that each of them are located at each apex of a triangle. Further, on air pads 21A, 221B, and 21C is set wafer chamber 23 (second stage chamber) as a substantially square, box-shaped, air-tight chamber via active type antivibration bases 22A, 22B, and 22C similar to antivibration bases 15A–15C; and wafer stage system WST is accommodated inside of wafer chamber 23. Thus, by jetting high-pressure gas from air pads 21A–21C, wafer chamber 23 can be smoothly moved on level block 2 with a little force. In this embodiment, a method by which a predetermined mechanism is moved by jetting high-pressure gas from an air pad is called an "air slide method."

Further, on the center portion of the bottom plate of wafer chamber 23 is fixed wafer base 24; and the upper surface of wafer base 24 is finished as a guide surface with a very high degree of flatness. On the guide surface are slidably mounted a first wafer stage 25A and a second wafer stage 25B so that each of the stages can be smoothly slid via an air bearing in the X- and Y-directions along X-axis guide member 27 and Y-axis guide member 26. Further, on wafer stage 25A and wafer stage 25B are held a first wafer W1 and a second wafer W2 by vacuum suction or the like, respectively. Wafer stages 25A and 25B are, by, e.g., a linear motor, continuously moved in the Y-direction and are stepwise moved in the X- and Y-directions. During those movements, wafer stages 25A and 25B are driven so that, with X-axis guide member 27 and Y-axis guide member 26 being moved in the opposite directions, the low of conservation of momentum with respect to each of the X- and Y-directions is satisfied; and thus it is so configured that almost no vibrations are generated during the stepwise movements and scanning exposure.

Further, Z-leveling mechanisms (specimen tables) in wafer stages 25A and 25B are configured so that, to perform leveling and focusing, wafers W1 and W2 can be displaced in the Z-direction and can be tilted around a pair of aces (i.e., around the X- and Y-axes). The wafer stage 10 of this embodiment is thus a double-wafer-stage system. Further, wafer interferometer 28 constituted of a laser interferometer is positioned so as to face moving mirrors (mirror surfaces) on the side faces of wafer stages 25A and 25B; and the positions in the X- and Y-directions and the rotational angles around the X-, Y-, and Z-axes of wafer stages 25A and 25B are measured by wafer interferometer 28 with reference to a reference mirror (not shown) in wafer chamber 23. Note that with respect to wafer interferometer 28 also, the position measurement of wafer stages 25A and 25B may be performed with reference to a reference mirror fixed on projection optical system PL.

In this embodiment, wafer stage system WST is constituted of wafer stages 25A and 25B, a drive device thereof (X-axis guide member 27, Y-axis guide member 26, etc.), wafer interferometer 28, etc.; and an aperture which makes exposure light IL pass through is formed at the center of the upper plate of wafer chamber 23. Further, wafer loader system WRD for changing wafers W1 and W2 on wafer stages 25A and 25B is set on level block 2 so as to neighbor the minus Y-direction side side face of wafer chamber 23. Wafer loader system WRD is, e.g., a box with some degree of hermeticity in which an exchange mechanism is accommodated. Still further, although not specifically illustrated, in wafer chamber 23 is positioned an alignment sensor for wafer alignment; and in reticle chamber 12 is positioned an alignment microscope for reticle alignment.

Further, in FIG. 1, on the plus Y-direction side end portion of supporting plate 16 of second frame mechanism 17 is fixed a Y-axis interferometer unit 31A; and measurement beams from this interferometer unit 31A are incident upon a Y-axis reference mirror 25A on projection optical system PL and upon a Y-axis moving mirror 24A on wafer chamber 23. Further, on the plus Y-direction side end portion of supporting plate 5 of first frame mechanism 6 is fixed auxiliary unit 32A for transmitting a measurement beam; and a measurement beam from interferometer unit 31A is, via auxiliary unit 32A, incident upon a Y-axis moving mirror 33A on reticle chamber 12. Interferometer unit 31A measures the positions in the Y-direction and the rotational angles around the Z-axis of reticle chamber 12 and wafer chamber 23 with reference to projection optical system PL (reference mirror 35A).

Similarly, in FIG. 2, on the minus X-direction side end portions of supporting plates 5 and 16 are fixed auxiliary unit 32A and interferometer unit 31B, respectively. Measurement beams from interferometer unit 31B are respectively incident upon a X-axis reference mirror 351 on projection optical system PL and upon an X-axis moving mirror 3413 on wafer chamber 23. Further, a measurement beam from interferometer unit 31B is, via auxiliary unit 32B, incident upon an X-axis moving mirror 33B on reticle chamber 12. Interferometer unit 31B measures the positions in the X-direction and the rotational angles around the Z-axis of reticle chamber 12 and wafer chamber 23 with reference to projection optical system PL (reference mirror 35B).

In this embodiment, by correcting the positional information of reticle stage 10 relative to reticle chamber 12 measured by reticle interferometer 11 and the positional information of wafer stages 25A and 25B relative to wafer chamber 23 measured by wafer interferometer 28 by the use of the positional information of reticle chamber 12 and wafer chamber 23 measured by interferometer units 31A and 31B with reference to projection optical system PL, the positional information of reticle stage 10 (reticles R1 and R2) and wafer stages 25A and 25B (wafers W1 and W2) can be measured with reference to projection optical system PL with high precision. And, by controlling, based on the measurement results, the movement of reticle stage 10 and wafer stages 25A and 25B, scanning exposure can be performed with high precision.

By this, when exposing pattern images of reticles R1 and R2 onto wafers W1 and W2, a high exposure accuracy (registration accuracy, transfer fidelity, etc.) can be obtained. Further, wafer stage system WST of this embodiment is a double-wafer-stage system; and thus because, for example, the replacement and alignment of wafer W2 mounted on the second wafer stage 25B can be executed during the scanning exposure of wafer W1 mounted on the first wafer stage 25A, a high throughput can be obtained.

Also, in FIGS. 1 and 2, on auxiliary units 32A and 32B fixed on first frame mechanism 6 are fixed edge sensors 39A and 39B which swings a laser beam, respectively. Edge sensors 39A and 39B can detect the X-direction position $X_{PL}$ and Y-direction position $Y_{PL}$ of projection optical system PL with reference to first frame mechanism 6 (supporting plate 5), respectively. It is to be noted that instead of edge sensors 39A and 39B for measuring the position of projection optical system PL, another type of position detection device such as a interferometer with higher precision may be used.

Now, in the projection exposure apparatus of this embodiment, vacuum ultraviolet light is used as exposure light IL. Thus, to obtain a high throughput by enhancing the transmittance of exposure light IL, i.e., by enhancing the illumination intensity of exposure light IL on wafers W1 and W2, purge gas with high transmittance (in this embodiment, helium gas) is supplied to the optical path of exposure light IL. That is, in FIG. 1, high-purity purge gas from a gas supply apparatus, not shown, is supplied, via piping, not shown, into sub-chamber 9, reticle chamber 12, projection optical system PL, and wafer chamber 23. And the gas (purge gas) inside of sub-chamber 9, reticle chamber 12, projection optical system PL, and wafer chamber 23 is, as required, recovered by the gas supply apparatus via piping, not shown, and is reused after impurities therein being removed by the use of a chemical filter or the like.

Further, in this embodiment, the space between sub-chamber 9 and reticle chamber 12, the space between reticle chamber 12 and projection optical system PL, the space between projection optical system PL and wafer chamber 23, and the space between wafer chamber 23 and wafer loader system WRD are respectively sealed by membranous, soft sealing members 29A, 29B, 29C, and 29D which have high flexibility and high gas blocking characteristics so that each of the spaces is separated from the atmosphere. The soft sealing members 29A, 29B, 29C, and 29D of this embodiment are made by shaping a soft sheet material into a bellows-type cylinder; and both of the end portions thereof are fixed, via, e.g., ceramic flange portions, to their respective, corresponding members by using screws or the like. Soft sealing member 29A, etc. can also be called a "covering member." The space between reticle chamber 12 and reticle loader system RRD is also sealed by the soft sealing member. Note that sealing members 29A–29D need not be shaped as a bellows, but, for example, may be made by shaping the soft sheet as it is into a cylinder.

By this, the optical path of exposure light IL from the illumination optical system to wafers W1 and W2 as substrates to be exposed is almost completely sealed. Thus, external gases including light absorbing substances hardly intrude on the optical path of exposure light IL, and the attenuation of the exposure light can be controlled within a very low level. In addition, through the use of soft sealing members 29A–29D, vibrations generated in, e.g., reticle chamber 12 and wafer chamber 23 are not transmitted to projection optical system PL, and thus the interaction of the vibrations is decreased. Further, the optical path in a transmission optical system (not shown) which is positioned between the exposure light source and the illumination optical system and which includes a beam matching unit which adjusts the optical relationship between the exposure light and the optical axis of the illumination optical system is also filled with the above-described purge gas; and thus the attenuation of the exposure light in the transmission optical system is controlled.

Further, when assembling the projection exposure apparatus of this embodiment, soft sealing member 29A, etc. can be easily fitted in a very short time only by fixing the flange portions with bolts or the like. Further, when moving wafer chamber 23 and frame mechanism 17 in order to replace, e.g., projection optical system PL, soft sealing member 29B, etc. can be extremely easily detached only by removing the bolts or the like of the flange portions. In addition, to facilitate the detachment of the piping for supplying the purge gas, various kinds of wiring, etc. when moving wafer chamber 23 and frame mechanism 17 in order to replace, e.g., projection optical system PL, the connecting portions of those piping and wiring are constituted of easily detachable joints.

Next, referring to FIG. 4, the relationship between second frame mechanism 17, which supports projection optical system PL of the projection exposure apparatus of this embodiment, and wafer chamber 23, which accommodates wafer stage system WST, will be described.

FIG. 4 is a plan view illustrating level block 2 in FIG. 1. In FIG. 4, on the substantially triangular, flat level block 2 are fixed the three columns 3A, 3B, and 3C of first frame mechanism 6 shown in FIG. 1 so that each column is located substantially at each apex of a triangle. Inside of the three columns 3A–3C are slidably mounted the three columns 14A–14C (which correspond to the "leg portions" of the present invention), a part of second frame mechanism 17, so that each column is located substantially at each apex of a triangle. Further, inside of the three columns 3A–3C are slidably mounted the three antivibration bases 22A–22C (which correspond to the "supporting portions" of the present invention), which support wafer chamber 23 (wafer stage system WST), so that each antivibration base is located substantially at each apex of a triangle. Further, on supporting plate 16, a part of frame mechanism 17, is supported projection optical system PL. Relative to this configuration, the Y-direction distance D2 between the two columns 14A and 14B among columns 14A–14C is set to be larger than the maximum, Y-direction width D1 of antivibration bases 22A–22C. In other words, the following formula holds:

$$D2 > D1 \qquad (1)$$

By this, wafer chamber 23 of this embodiment can be pulled out toward the plus X-direction (toward the front side of the apparatus), indicated by arrow A1, through the space between columns 14A–14C of second frame mechanism 17. After this operation, second frame mechanism 17, on which projection optical system PL is mounted, can be pulled out toward the plus X-direction, indicated by arrow A1.

Next, referring to the flowchart of FIG. 6, an assembly sequence example applied to the manufacture of the projection exposure apparatus of this embodiment will be described.

Figure 6:
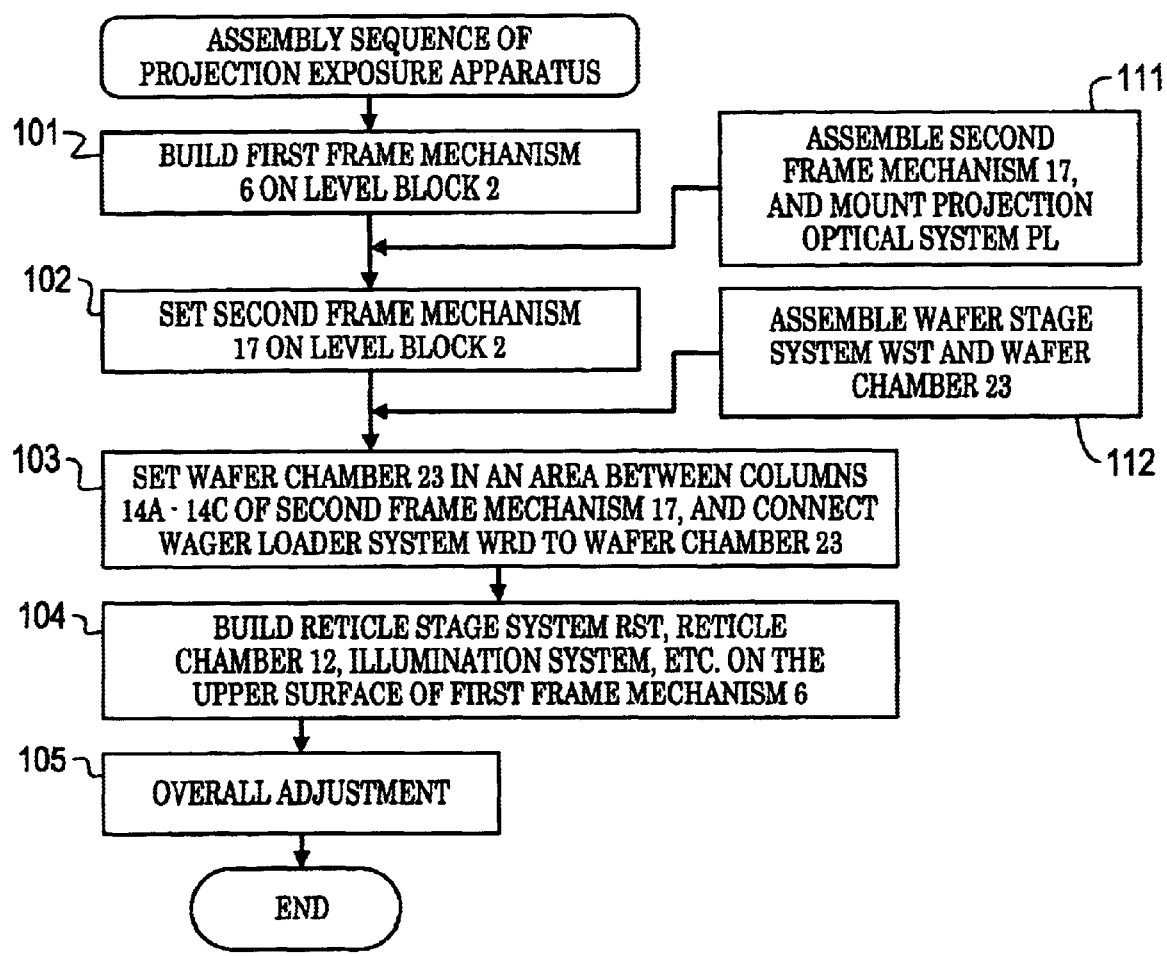
FIG. 6 is a flowchart illustrating an example of an assembly sequence of the projection exposure apparatus of FIG. 1.

At step 101 of FIG. 6, level block 2 in FIG. 1 is set on, e.g., a floor in a clean room of a semiconductor manufacturing plant, and first frame mechanism 6 of FIG. 1 is next built on level block 2. Prior to this work, at step 111 in advance, second frame mechanism 17 of FIG. 1 is assembled, and projection optical system PL, of which optical characteristics has been adjusted, is mounted on cut-out portion 16a of supporting plate 16 of frame mechanism 17. Next, at step 102, second frame mechanism 17, on which projection optical system PL is supported, is mounted on level block 2. When executing this mounting work, the compressor is connected to air pads 13A–13C, and frame mechanism 17 is smoothly slid on level block 2 by using the air slide method.

In parallel with the above works, at step 112, wafer stage system WST and wafer chamber 23 are assembled and adjusted. Next, at step 103, in an area (inside area), on level block 2, between columns 14A–14C of second frame mechanism 17 is set wafer chamber 23 via air pads 13A–13C and antivibration bases 22A–22C, and wafer loader system WRD is connected to wafer chamber 23. When executing this setting work, wafer chamber 23 is smoothly slid by using the air slide method. At the subsequent step 104, on first frame mechanism 6 are built reticle stage system RST, reticle chamber 12, sub-chamber 9, which accommodates the illumination optical system, reticle loader system RRD, etc. During this process, the illumination optical system is connected to the above-described transmission optical system (not shown), which is connected to the exposure light source.

In this embodiment, the illumination optical system is entirely accommodated in sub-chamber 9; however, it is to be noted that it may also be configured that only a part of the illumination optical system is accommodated in sub-chamber 9 and the rest is accommodated in a separate sub-chamber. For example, in sub-chamber 9 is accommodated a part of the illumination optical system, the part being the illumination optical system's partial optical system positioned on the reticle side of a field stop (reticle blind or masking blade), the field stop being positioned, in the illumination optical system, substantially conjugate with the pattern surface of the reticle and being driven in a synchronization with the movement of the reticle and wafer during scanning exposure; and the rest (including the field stop) is accommodated in the separate sub-chamber. This separate sub-chamber is preferably supported by a separate frame mechanism different from, e.g., first frame mechanism 6. Further, the separate frame mechanism may preferably be positioned, relative to first frame mechanism 6, on, e.g., level block 2, on the opposite direction (minus X-direction) side to the plus X-direction, the plus X-direction being the direction, in which second frame mechanism 17 and wafer chamber 23 are pulled out. Further, the separate frame mechanism is built prior to or in parallel with, e.g., building first frame mechanism 6 on level block 2.

At the subsequent step 105, mechanical-, electrical-, and optical-overall-adjustments are made, the purge gas supply mechanism is provided, soft sealing members 29A–29D are fitted, the purge gas supply mechanism is adjusted; and thus the modular type (or box type) projection exposure apparatus of this embodiment is completed. At this stage, the X-direction position $X_{PL}$ and Y-direction position $Y_{PL}$ of projection optical system PL relative to first frame mechanism 6 are detected by edge sensors 39A and 39B of FIGS. 1 and 2, and then the detected results are stored into a storage of a centralized controller, not shown.

Figure 7:
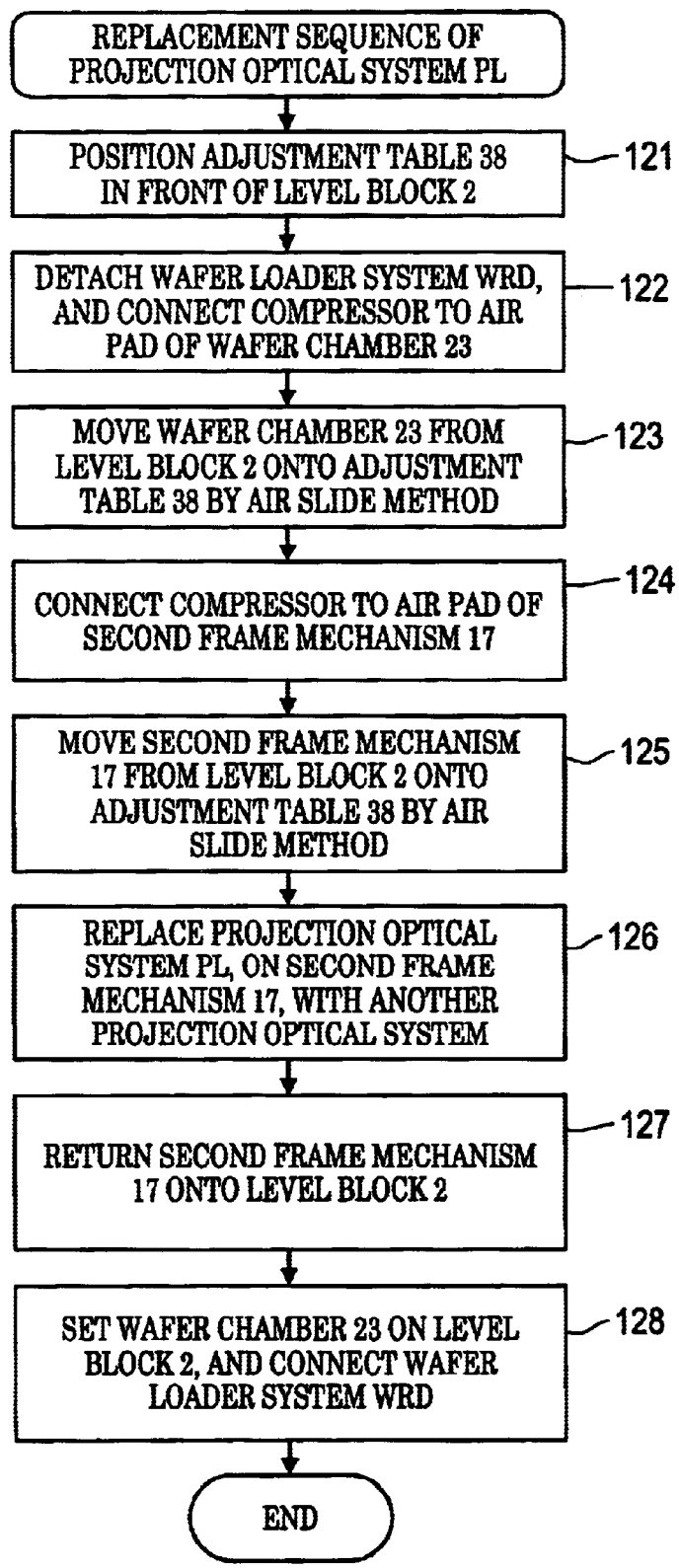
FIG. 7 is a flowchart illustrating an example of a replacement sequence of the projection optical system of the projection exposure apparatus of FIG. 1.

In the subsequent, longtime exposure process using the projection optical apparatus of FIG. 1, when the transmittance of the projection optical system PL decreases to a level below a permissible level because fogging materials have adhered on, e.g., the optical elements (lenses, etc.) constituting the projection optical system PL or when a predetermined aberration deteriorates down to a level below a permissible level, a replacement sequence of the projection optical system PL is executed to readjust projection optical system PL, as shown in FIG. 7.

First, at step 121 of FIG. 7, a flat adjustment table 38 (shown by the alternate long and two short dashes lines in FIG. 2), which has the same thickness as level block 2, is positioned in front of level block 2. Next, at step 122, after soft sealing members 29B, 29C, and 29D being detached and after, as shown by arrow A3 in FIG. 4, wafer loader system WRD being detached, a compressor, not shown, is connected to the air pads 21A–21C of wafer chamber 23. Next, as shown by arrow A1 in FIG. 2, wafer chamber 23 is slid in the plus X-direction by using the air slide method and is moved from level block 2 onto adjustment table 38 (step 123).

After this, the compressor is connected to air pads 13A–13C of second frame mechanism 17 (step 124). Next, as shown by arrow A2 in FIG. 2, second frame mechanism 17 is slid in the plus X-direction by using the air slide method and is moved to position 17A on adjustment table 38 (step 125). Thus, projection optical system PL is moved to position PLA.

Next, at step 126, projection optical system PL is, on second frame mechanism 17, replaced with another projection optical system of the same model, of which optical characteristics, etc. have been adjusted. It is to be noted that when, for example, cleaning and the like of the fogging materials from the optical elements (lenses, etc.) constituting the projection optical system PL can be completed easily and quickly, only the cleaning and the like may be done without executing the replacing work of projection optical system PL.

Subsequently, at step 127, second frame mechanism 17, on which the adjusted projection optical system is mounted, is returned onto level block 2 using the air slide method. In this process, second frame mechanism 17 is positioned so that the X- and Y-direction positions of the projection optical system detected by edge sensors 39A and 39B coincide with the positions $X_{PL}$ and $Y_{PL}$, which have been stored as described above, respectively.

Next, at step 128, wafer chamber 23 is returned to the space between columns 14A–14C of second frame mechanism 17 by moving wafer chamber 23 using the air slide method; and then wafer loader system WRD is connected to wafer chamber 23. Finally, by fitting soft sealing members 29B, 29C, and 29D after executing the positional relationship adjustment of wafer chamber 23 and other operations, the replacement sequence of the projection optical system PL is completed.

As described above, in the projection exposure apparatus of this embodiment, wafer chamber 23 (antivibration bases 22A–22C) is set between columns 14A–14C of second frame mechanism 17, which supports projection optical system PL, in a state that the chamber can be slid. Thus, after moving wafer chamber 23 onto adjustment table 38, second frame mechanism 17 can be moved onto adjustment table 38 extremely easily and quickly. Therefore, projection optical system PL can be replaced extremely easily and quickly. Furthermore, by moving wafer chamber 23 and second frame mechanism 17 using the air slide method, the operating efficiency further improves.

In addition, when projection optical system PL is replaced, the position of the newly provided projection optical system is set to be the same as the original position by using edge sensors 39A and 39B. Thus, the optical adjustment thereof after the replacement can be completed in an extremely short time. Similarly, the adjustment time of the returned wafer chamber 23 can be shortened by aligning the chamber with reference to, e.g., second frame mechanism 17. Further, as illustrated in FIG. 1, both of reticle loader system RRD and wafer loader system WRD are set on the side face of the main body of the exposure apparatus.

Therefore, the front side space of the main body of the exposure apparatus can be used as a space where projection optical system PL is adjusted when it is replaced.

It is to be noted that it may also be so configured that with reticle loader system RRD and wafer loader system WRD being set on the front face of the main body of the exposure apparatus, second frame mechanism 17 (projection optical system PL) and wafer chamber 23 are pulled out, relative to the main body of the exposure apparatus, toward the side face side of the main body; or after shifting reticle loader system RRD and wafer loader system WRD from the front face of the main body of the exposure apparatus, second frame mechanism 17 and wafer chamber 23 are pulled out toward the front face side of the main body of the exposure apparatus.

Next, referring to FIG. 5, another embodiment of the present invention will be described.

Figure 5:
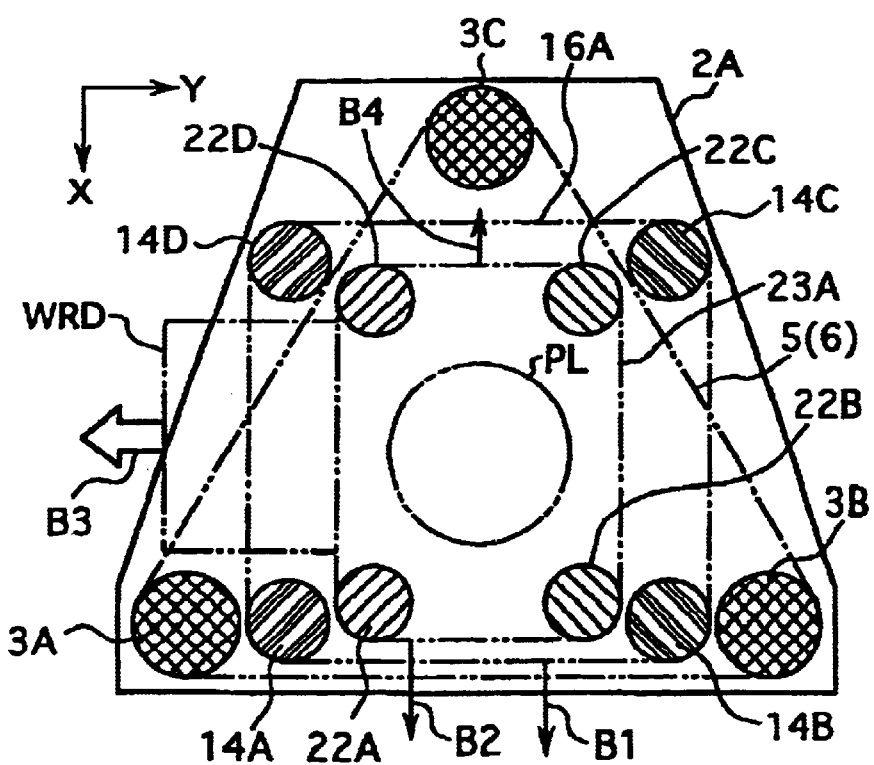
FIG. 5 is a plan view, similar to FIG. 4, illustrating a level block applied to a projection exposure apparatus of another embodiment according to the present invention.

FIG. 5 is a plan view illustrating a substantially trapezoid-shaped level block 2A, which is applied to the projection exposure apparatus of this embodiment and corresponds to level block 2 in FIG. 4. Note that because this projection exposure apparatus differs from the projection exposure apparatus of FIG. 1 only in the configurations of the first frame mechanism, which supports projection optical system PL, and of the antivibration bases, which supports the wafer chamber, the following descriptions will be made focusing the differences, omitting descriptions of other configurations.

In FIG. 5, on level block 2A are fixed the three columns 3A–3C of the first frame mechanism 6, shown in FIG. 1, so that each column is located at each apex of a triangle. Inside of the three columns 3A–3C are slidably mounted the four columns 14A–14D (leg portions), a part of second frame mechanism 17 (not shown, in FIG. 5), so that each column is located substantially at each apex of a square. Further, on this second frame mechanism is fixed supporting plate 16A, which supports projection optical system PL. Still further, inside of columns 14A–14D are slidably mounted the four antivibration bases 22A–22D (supporting portions), which support wafer chamber 23A (which accommodates the wafer stage system WST of FIG. 1), so that each antivibration base is located substantially at each apex of a rectangle. Relative to this configuration, the Y-direction distance of columns 14A–14D is set to be larger than the maximum, Y-direction width of antivibration bases 22A–22D.

By this, wafer chamber 23A of this embodiment can be slid toward the minus X-direction (toward the back side of the apparatus), indicated by arrow B4, through the space between columns 14A–14D of the second frame mechanism. Therefore, when replacing the projection optical system PL of this embodiment, supporting plate 16A (the second frame mechanism) can be pulled out toward the plus X-direction indicated by arrow B1, opposite to the direction indicated by arrow B4, without wafer chamber 23A being moved. Thus, according to this embodiment, because when projection optical system PL is replaced, supporting plate 16A (the second frame mechanism), which supports projection optical system PL, can be carried out, with wafer chamber 23A still being mounted on level block 2A, projection optical system PL can be replaced in a shorter time.

In each of the above-described embodiments, the frame mechanisms (second frame mechanism 17, etc.), which support projection optical system PL, are supported by the three columns 14A–14C or by the four columns 14A–14D; however, the number of the columns (leg portions) may be set arbitrarily, and the leg portions may also be integrally formed as a V-shaped member, U-shaped member, or the like. Still further, the leg portions may be integrally formed with, e.g., supporting plate 16 or with supporting plate 16A. Similarly, the number of antivibration bases 22A–22C (or 22A–22D), which support wafer chamber 23, may be set arbitrarily; in brief, any configurations by which wafer chambers 23, 23A or the frame mechanism which supports projection optical system PL can be slid on level block 2 or 2A in a predetermined direction would suffice.

In each of the above-described embodiments, because air pads 13A–13C are provided on the bottom surface of second frame mechanism 17, second frame mechanism 17 can be smoothly slid using the air slide method. However, when, for example, a small-sized crane or the like is adopted for moving, e.g., second frame mechanism 17, air pads 13A–13C need not be provided. Similarly, with respect to wafer chambers 23 and 23A, when a small-sized crane or the like is adopted for moving them, air pads 21A–21C need not be provided.

In this connection, the mechanisms, by which second frame mechanism 17 and wafer chambers 23 and 23A are slid, are not limited to ones using the the air slide method. For example, when a crane or the like is adopted for moving them, their movement is realized virtually in a non-contact manner. Also, second frame mechanism 17, etc. may be slid via a sliding mechanism with very little resisting force such as a ball-bearing.

By the way, there may be a case in which, in FIG. 1, because the working distance between the pattern surface on reticles R1 and R2 and projection optical system PL is short, the top portion of projection optical system PL is covered with supporting plate 5. To address such a layout, by adopting a configuration by which projection optical system PL can be lowered relative to supporting plate 16 or by providing an up-and-down movement mechanism to columns 14A–14C, projection optical system PL or supporting plate 16 may be lowered before pulling second frame mechanism 17 out.

Further, in each of the above-described embodiments, the position of the newly provided projection optical system is measured; however, it may also be so configured that by providing on, e.g., supporting plate 16 a modularized wafer alignment sensor, a modularized auto-focus sensor of water, etc., the position of the alignment sensor or the auto-focus sensor is measured.

Further, in each of the above-described embodiments, it is supposed that the projection optical system is replaced with another projection optical system; however, it may also be so configured that only a part of the projection optical system is replaced. In this case, the replacement may be performed on the projection optical system on an optical element basis or, when the projection optical system has a plurality of lens barrels, on a lens barrel basis. Further, the part may be replaced after the entirety of the projection optical system being dismounted from the frame mechanism (second frame mechanism 17, etc), which supports the projection optical system, or only the part, necessary to be replaced, may be detached from the projection optical system with the projection optical system being still supported by the frame mechanism.

Still further, instead of replacing a part of the projection optical system pulled out of the main body of the exposure apparatus, the part may only be detached from the frame mechanism, which supports the projection optical system, adjusted, and returned to the projection optical system. In this adjustment process, for example, cleaning, reprocessing, or the like of an optical element is performed; and, in particular, with respect to a lens element, its surface is processed as an aspherical surface as required. This optical element may be, without being limited to a refractive optical element such as a lens element, a reflective optical element such as a concave mirror or an aberration correcting plate, which corrects aberrations of the projection optical system (distortion, spherical, etc.), in particular, non-rotation-symmetrical components thereof. Further, without detaching from the frame mechanism a part of the projection optical system pulled out of the main body of the exposure apparatus, the position (including the distance from other optical elements), the inclination, or the like of at least one optical element may only be changed. In particular, when the optical element is a lens element, the decentering amount thereof may be changed, or the lens element may be rotated around the optical axis.

In addition, in each of the above-described embodiments, it is supposed that the dismount, replacement, adjustment, etc. of the projection optical system (projection system) are performed at a point of delivery of the projection exposure apparatus (semiconductor device manufacturing plant, etc.); however, it may also be so configured that the adjustment of the projection optical system, etc. are performed in a projection exposure apparatus manufacturing plant by a similarly applying the present invention.

Further, after the operation of projection exposure apparatus is begun at its point of delivery, the transmittance of projection optical system PL is periodically measured by using, e.g., a photodetector (such as an illumination distribution sensor, illumination amount monitor, and the like), of which light receiving surface is positioned on wafer stage WST, and, in between the periodical measurements, the change of the transmittance is calculated through calculation (simulation, etc.). Further, by using an aerial image detector, which detects a reticle pattern image and of which light receiving surface is positioned on wafer stage WST or by, with the pattern image being transferred onto a wafer or the like, detecting the transferred image (latent image, resist image, etc.), the optical characteristics (aberrations, etc.) of the projection optical system is periodically measured, and, in between the periodical measurements, the change of the optical characteristics is calculated through calculation.

Further, when, for example, the transmittance of the projection optical system reaches a permissible value (lower limit value), at which the replacement or adjustment of the projection optical system is necessitated, or when the optical characteristics of the projection optical system deteriorate over their permissible levels, at which the replacement or adjustment of the projection optical system is necessitated, the centralized controller (not shown), which exercises overall-control of the entire projection exposure apparatus, stops the exposure operation; and preferably, the controller displays a warning on a display (monitor) of the projection exposure apparatus or advises the operator of the necessity for the replacement or adjustment, via the internet or a cellular phone. Associated with this process, information necessary for the replacement or adjustment of the projection optical system, i.e., information as to whether the projection optical system (or a part thereof) is to be replaced or as to which part of the projection optical system is to be replaced, information as to which part of the projection optical system is to be adjusted and how to adjust that part, and other information, is preferably advised of. By this, not only the process time required for the replacement or adjustment of the projection optical system but also the preparation time for them can be shortened, which enables the down time of the projection optical system to be shortened, i.e., enables the operation rate to be improved.

Further, it is preferable that after the projection optical system, with which the old one is replaced or of which adjustment is completed, being returned to the main body of the exposure apparatus, the optical characteristics of the projection optical system are measured by the above-mentioned aerial image detector or by detecting the transferred image, and, if necessary, the optical characteristics are adjusted based on the measurement results. To execute this adjustment of the optical characteristics, it may be, for example, so configured that at least one of the optical elements of the projection optical system is driven by an actuator (such as a piezo-element), or the center wavelength of the exposure light is slightly shifted by adjusting the exposure light source.

Further, with respect to each of the above-described embodiments, the aberrations, etc. of the projection optical system may be calculated by first measuring the wavefront aberration of the projection optical system and then using the measured wavefront aberration and the polynomials of Zernike. To execute this wavefront aberration measurement process, it may be, for example, so configured that first, a projected image of the reticle pattern through, e.g., a pinhole positioned between the reticle and the projection optical system is formed; next, the projected image is detected by a two-dimensional CCD or the like, or the projected image is transferred onto a wafer or the like; and then, the wavefront aberration is measured based on the difference between the position of the projected image or of the transferred image and a predetermined reference position.

Further, because the projection exposure apparatus of each of the above-described embodiments is a modular type (box type) projection exposure apparatus, the present invention can be applied very effectively to them; however, the present invention can also be applied to other type projection exposure apparatuses such as a projection exposure apparatus which is constructed by successively adding, on a base member, the component parts of, e.g., the reticle stage system and of the wafer stage system. Similarly, when a single-holder type single-stage system is adopted instead of the reticle stage system RST or the wafer stage system WST of each of the above-described embodiments, the present invention can be equally applied.

Further, in each of the above-described embodiments, level block 2 or 2A is used as the base member; however, the base member, without being limited to the level block, may be implemented utilizing, e.g., a frame caster (a base plate provided with wheels for carriage) or the floor, in the clean room, on which the projection exposure apparatus is set.

Still further, projection optical system PL may be any one of a refractive system, a catadioptric system, and a reflective system; and projection optical system PL may also be any one of a reduction system, a unit magnification system, and a magnifying system. Further, projection optical system PL may, without being limited to a straight-barrel type system or a double-barrel type system, be implemented, for example, by a combination of a straight-barrel type first lens barrel and a second lens barrel disposed perpendicular to the first lens barrel.

Further, in each of the above-described embodiments, the present invention is applied to the scanning exposure type projection exposure apparatus; however, without being limited to this, the present invention can also be similarly applied to a one-shot exposure (stationary exposure) type projection exposure apparatus such as a step-and-scan type projection exposure apparatus, a proximity type exposure apparatus, an exposure apparatus in which UVU light or X-rays is used as its exposure beam, and a charged-particlebeam exposure apparatus, in which an electron beam or ion beam (energy beam) is used as its light source (energy source).

Further, with respect to the range of uses of the exposure apparatus, the exposure apparatus can, without being limited to be used as an exposure apparatus for manufacturing semiconductor devices, be widely used as an exposure apparatus for manufacturing display units such as a liquid crystal display device or a plasma display, formed on a quadrangular glass plate, and as an exposure apparatus for manufacturing various kinds of devices such as a micromachine, a thin film magnetic head, and a DNA chip. Further, the present invention can also be applied to an exposure process (exposure apparatus) in which a mask (photomask, reticle, etc.), on which a pattern of various kinds of devices is formed, is manufactured by using a photolithography process.

Further, when a linear motor is used for the wafer stage system or the reticle stage system, the movable stage may be held by using any of an air-floating type system, a magnetically-levitating system, and the like. Further, when the reaction force of the movable stage is to be cancelled, the reaction force may be released to the floor instead of cancelling it through the law of conservation of momentum.

It should also be noted that semiconductor devices are manufactured through a train of processes comprising a step for designing their functions and performance, a step for manufacturing a reticle in accordance with the design step, a step for producing a wafer from a silicon material, a step for exposing the wafer with the pattern on the reticle by the use of the exposure apparatus of the above-mentioned embodiments, a device assembling step (including a dicing process, a bonding process, a packaging process, etc.), a step for testing, etc.

Needless to say, the present invention is not limited to the above-mentioned embodiments, and various configurations may be employed without departing from the spirit and scope of the present invention.

All of the disclosed contents of Japanese Patent Application No. 2000-51107 filed on Feb. 28, 2000, including Specification, Scope of the claim, Drawings, and Abstract are hereby incorporated by reference.

What is claimed is:

1. A projection exposure apparatus by which an object is exposed with an exposure beam via a projection system, said projection exposure apparatus comprising:
    a base member; and
    a main body mounted on the base member to expose said object with said exposure beam, the main body including a frame mechanism which is movable in a predetermined direction substantially parallel to a surface of said base member and on which said projection system is mounted, said projection system being taken out of the main body by moving the frame mechanism in said predetermined direction on said base member.

2. A projection exposure apparatus by which an object is exposed with an exposure beam via a projection system, said projection exposure apparatus comprising:
    a base member; and
    a main body mounted on the base member to expose said object with said expose beam, the main body including a frame mechanism on which said projection system is mounted and which is disposed on said base member via first leg portions and a stage system which moves said object, at least of which a supporting portion is positioned inside of an area on said base member surrounded by said first leg portions, the supporting portion including second leg portions different from said first leg portions and being movable in a predetermined direction substantially parallel to a surface of said base member, and said stage system being taken out of the main body by moving the supporting portion in said predetermined direction on said base member.

3. An apparatus according to claim 2, wherein
said frame mechanism has three first leg portions which are positioned substantially corresponding to each apex of a triangle; and
the width of said supporting portion of said stage system is smaller than the distance between a pair of first leg portions among said three first leg portions.

4. An apparatus according to claim 2, wherein
said frame mechanism has four first leg portions which are positioned substantially corresponding to each apex of a rectangle; and
the width of said supporting portion of said stage system is smaller than the distance between a pair of first leg portions among said four first leg portions.

5. An apparatus according to claim 2, wherein said frame mechanism is movable on said base member to take said projection system out of said main body by moving said frame mechanism.

6. An apparatus according to claim 5, further comprising:
an air pad for jetting compressed gas at a bottom surface of said first leg portions when said frame mechanism is moved.

7. A projection exposure apparatus comprising:
    an exposure main body in which at least a part of an illumination system to illuminate a first object with an exposure beam and a projection system to project a pattern image of said first object on a second object are optically aligned with each other and which exposes said second object via said projection system with said exposure beam irradiated on said first object;
    a first frame mechanism which supports a first portion of said exposure main body on a predetermined surface; and
    a second frame mechanism which supports a second portion of said exposure main body different from said first portion on said predetermined surface and at least a portion of which is positioned, on said predetermined surface, inside of said first frame mechanism, said second frame mechanism being movable in a first direction substantially parallel to said predetermined surface and the width of said at least portion of said second frame mechanism positioned inside of said first frame mechanism being narrower than that of said first frame mechanism with respect to a second direction intersecting said first direction, and said second portion being taken out of said exposure main body by moving said second frame mechanism in said first direction on said predetermined surface.

8. An apparatus according to claim 7, wherein
said second portion includes said projection system.

9. An apparatus according to claim 8, wherein
said first portion includes a first movable member on which said first object is mounted.

10. An apparatus according to claim 8, wherein
said first potion includes at least a portion of said illumination system.

11. An apparatus according to claim 8, further comprising:
a stage system which is positioned on said predetermined surface and inside of said second frame mechanism and which includes a second movable member on which said second object is mounted.

12. An apparatus according to claim 11, further comprising:

a conveyance mechanism which is connected to said stage system and transfers said second object, wherein said conveyance mechanism is disconnected from said stage system when said second frame mechanism is moved.

13. An apparatus according to claim 7, wherein said second portion includes a second movable member on which said second object is mounted.

14. An apparatus according to claim 13, wherein said first portion includes said projection system, and said first frame mechanism is movable on said predetermined surface.

15. A manufacturing method of a projection exposure apparatus which exposes an object with an exposure beam via a projection system, comprising:

disposing a main body on a base member, the main body including a frame mechanism which supports said projection system on the base member via first leg portions; and disposing, in an area on said base member surrounded by said first leg portions, a stage system supported by second leg portions different from said first leg portions, which moves said object and which is movable in a predetermined direction substantially parallel to a surface of said base member to take said stage system out of the main body.

16. A method according to claim 15, wherein when at least a portion of said projection system is replaced or adjusted, said stage system is carried, along said predetermined direction, out of said base member, and said frame mechanism is carried out of said base member, in a state that said frame mechanism is supporting said projection system.

17. A method according to claim 15, wherein when at least a portion of said projection system is replaced or adjusted, in order to carry said frame mechanism out of said base member, said frame mechanism is moved in the direction opposite to said predetermined direction, in a state that said frame mechanism is supporting said projection system.

18. A method according to claim 15, wherein when said frame mechanism is moved, compressed gas is jetted against said base member from said first leg portions of said frame mechanism.

19. A manufacturing method of a projection exposure apparatus, comprising:

disposing on a predetermined surface a first frame mechanism which supports a first portion of an exposure main body which illuminates a first object with an exposure beam and exposes a second object with said exposure beam via a projection system; and disposing on said predetermined surface a second frame mechanism movable in a first direction substantially parallel to said predetermined surface, at least a portion of which is positioned inside of said first frame mechanism, with the width of said at least portion positioned inside of said first frame mechanism being narrower than that of said first frame mechanism with respect to a second direction intersecting said first direction on said predetermined surface, said second frame mechanism supporting a second portion of said exposure main body which is different from said first portion and includes said projection system, and said second portion being taken out of said exposure main body by moving said second frame mechanism in said first direction on said predetermined surface.

20. A method according to claim 19, further comprising:

disposing, on said predetermined surface and inside of said second frame mechanism, a stage system which includes a movable member on which said second object is mounted.

21. An adjusting method of a projection exposure apparatus, comprising:

on a mounted surface of a first frame mechanism which supports a first portion of an exposure main body which illuminates a first object with an exposure beam and exposes a second object with said exposure beam via a projection system, moving a second frame mechanism at least a portion of which is positioned inside of said first frame mechanism, with the width of said portion positioned inside of said first frame mechanism being narrower than said first frame mechanism with respect to a second direction intersecting a first direction, and which supports a second portion of said exposure main body which is different from said first portion and includes said projection system in said first direction, whereby said projection system is pulled out of said exposure main body; and replacing or adjusting at least a portion of said projection system.

22. A method according to claim 21, further comprising:

prior to the moving of said second frame mechanism, moving a stage system which is disposed on said mounted surface and inside of said second frame mechanism and which includes a movable member on which said second object is mounted.

23. A method according to claim 21, further comprising:

prior to the moving of said second frame mechanism, disconnecting a conveyance mechanism which transfers said second object from said stage system which includes said movable member on which said second object is mounted.

24. A method according to claim 21 wherein the timing at which said projection system is pulled out is determined based on at least one of the transmittance of said projection system and the optical characteristics of said projection system.

25. A method according to claim 21, further comprising:

after returning said projection system at least a portion of which has been replaced or adjusted to said exposure main body, measuring the optical characteristics thereof.

26. A method according to claim 25, wherein the wavefront aberration of said projection system is measured; and at least one of a wavelength shift of said exposure beam and a movement of at least one optical element of said projection system is done.

* * * * *